United States Patent
Long et al.

(10) Patent No.: US 7,625,601 B2
(45) Date of Patent: *Dec. 1, 2009

(54) CONTROLLABLY FEEDING ORGANIC MATERIAL IN MAKING OLEDS

(75) Inventors: Michael Long, Hilton, NY (US); Thomas W. Palone, Rochester, NY (US); Bruce E. Koppe, Caledonia, NY (US)

(73) Assignee: Eastman Kodak Company, Rochester, NY (US)

( * ) Notice: Subject to any disclaimer, the term of this patent is extended or adjusted under 35 U.S.C. 154(b) by 787 days.

This patent is subject to a terminal disclaimer.

(21) Appl. No.: 11/050,924

(22) Filed: Feb. 4, 2005

(65) Prior Publication Data

US 2006/0177576 A1 Aug. 10, 2006

(51) Int. Cl.
*C23C 16/00* (2006.01)
(52) U.S. Cl. ........................ 427/248.1; 427/66; 427/69; 427/70; 118/726
(58) Field of Classification Search ................ 118/726; 427/69–70, 66, 248.1–255.7; 141/325, 383
See application file for complete search history.

(56) References Cited

U.S. PATENT DOCUMENTS

| | | | |
|---|---|---|---|
| 2,447,789 A | 8/1948 | Barr | |
| 4,748,313 A * | 5/1988 | de Rudnay | 392/391 |
| 4,769,292 A | 9/1988 | Tang et al. | |
| 4,885,211 A | 12/1989 | Tang et al. | |
| 5,567,463 A | 10/1996 | Schaaf | |
| 5,945,163 A | 8/1999 | Powell et al. | |
| 6,470,737 B1 * | 10/2002 | De Bona et al. | 73/64.56 |
| 2002/0039604 A1 | 4/2002 | Yamaguchi et al. | |
| 2003/0168013 A1 * | 9/2003 | Freeman et al. | 118/726 |
| 2004/0000270 A1 * | 1/2004 | Carpenter et al. | 118/723 VE |
| 2004/0001916 A1 * | 1/2004 | Boffito et al. | 427/248.1 |
| 2005/0072361 A1 * | 4/2005 | Yang et al. | 118/726 |

FOREIGN PATENT DOCUMENTS

| | | | |
|---|---|---|---|
| EP | 0 585 848 | | 3/1994 |
| EP | 0 982 411 | | 1/2000 |
| JP | 2000-248358 | * | 9/2000 |
| JP | 2003-293121 | * | 10/2003 |

* cited by examiner

*Primary Examiner*—Timothy H Meeks
*Assistant Examiner*—Jimmy Lin
(74) *Attorney, Agent, or Firm*—Raymond L. Owens

(57) ABSTRACT

A method for metering powdered or granular material onto a heated surface to vaporize such material, includes providing a container with powdered or granular material having at least one component; providing a rotatable auger disposed in material receiving relationship with the container for receiving powdered or granular material from the container and as the auger rotates, such rotating auger translates such powdered or granular material along a feed path to a feeding location; and providing at least one opening at the feeding location such that the pressure produced by the rotating auger at the feeding location causes the powdered or granular material to be forced through the opening onto the heated surface in a controllable manner.

8 Claims, 4 Drawing Sheets

US 7,625,601 B2

CONTROLLABLY FEEDING ORGANIC MATERIAL IN MAKING OLEDS

CROSS REFERENCE TO RELATED APPLICATIONS

Reference is made to commonly assigned U.S. patent application Ser. No. 10/945,941 filed Sep. 21, 2004, entitled "Delivering Organic Powder to a Vaporization Zone" by Long et al, and U.S. patent application Ser. No. 11/050.934 filed Feb. 4. 2005. now U.S. Pat. No. 7,165,340, entitled "Feeding Organic Material to a Heated Surface" by Long et al, the disclosures of which are herein incorporated by reference.

FIELD OF THE INVENTION

The present invention relates to making organic light emitting diode (OLED) devices and more particularly to controllably feeding organic material to a heated surface.

BACKGROUND OF THE INVENTION

An OLED device includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

Physical vapor deposition in a vacuum environment is the principal means of depositing thin organic material films as used in small molecule OLED devices. Such methods are well known, for example Barr in U.S. Pat. No. 2,447,789 and Tanabe et al. in EP 0 982 411. The organic materials used in the manufacture of OLED devices are often subject to degradation when maintained at or near the desired rate dependant vaporization temperature for extended periods of time. Exposure of sensitive organic materials to higher temperatures can cause changes in the structure of the molecules and associated changes in material properties. To overcome the thermal sensitivity of these materials, only small quantities of organic materials have been loaded in sources and they are heated as little as possible. In this manner, the material is consumed before it has reached the temperature exposure threshold to cause significant degradation. The limitations with this practice are that the available vaporization rate is very low due to the limitation on heater temperature, and the operation time of the source is very short due to the small quantity of material present in the source. In the prior art, it has been necessary to vent the deposition chamber, disassemble and clean the vapor source, refill the source, reestablish vacuum in the deposition chamber and degas the just-introduced organic material over several hours before resuming operation. The low deposition rate and the frequent and time consuming process associated with recharging a source has placed substantial limitations on the throughput of OLED manufacturing facilities.

A secondary consequence of heating the entire organic material charge to roughly the same temperature is that it is impractical to mix additional organic materials, such as dopants, with a host material unless the vaporization behavior and vapor pressure of the dopant is very close to that of the host material. This is generally not the case and as a result, prior art devices frequently require the use of separate sources to co-deposit host and dopant materials.

A consequence of using single component sources is that many sources are required in order to produce films containing a host and multiple dopants. These sources are arrayed one next to the other with the outer sources angled toward the center to approximate a co-deposition condition. In practice, the number of linear sources used to co-deposit different materials has been limited to three. This restriction has imposed a substantial limitation on the architecture of OLED devices, increases the necessary size and cost of the vacuum deposition chamber and decreases the reliability of the system.

Additionally, the use of separate sources creates a gradient effect in the deposited film where the material in the source closest to the advancing substrate is over represented in the initial film immediately adjacent the substrate while the material in the last source is over represented in the final film surface. This gradient co-deposition is unavoidable in prior art sources where a single material is vaporized from each of multiple sources. The gradient in the deposited film is especially evident when the contribution of either of the end sources is more than a few percent of the central source, such as when a co-host is used.

A further limitation of prior art sources is that the geometry of the interior of the vapor manifold changes as the organic material charge is consumed. This change requires that the heater temperature change to maintain a constant vaporization rate and it is observed that the overall plume shape of the vapor exiting the orifices can change as a function of the organic material thickness and distribution in the source, particularly when the conductance to vapor flow in the source with a full charge of material is low enough to sustain pressure gradients from non-uniform vaporization within the source. In this case, as the material charge is consumed, the conductance increases and the pressure distribution and hence overall plume shape improve.

SUMMARY OF THE INVENTION

It is therefore an object of the present invention to provide an effective way to vaporize powders.

This object is achieved by a method for metering powdered or granular material onto a heated surface to vaporize such material, comprising:

(a) providing a container with powdered or granular material having at least one component;

(b) providing a rotatable auger disposed in material receiving relationship with the container for receiving powdered or granular material from the container and as the auger rotates, such rotating auger translates such powdered or granular material along a feed path to a feeding location; and (c) providing at least one opening at the feeding location such that the pressure produced by the rotating auger at the feeding location causes the powdered or granular material to be forced through the opening onto the heated surface in a controllable manner.

DETAILED DESCRIPTION OF THE INVENTION

Figure 1:
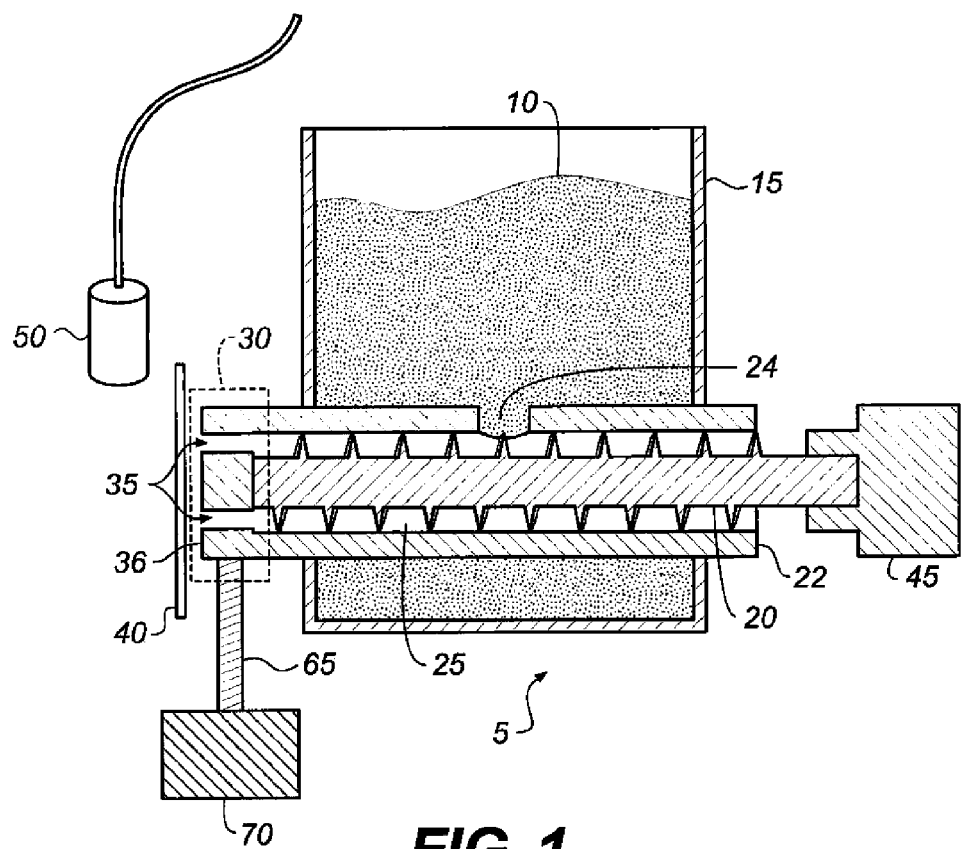
FIG. 1 is a sectional view of one embodiment of the invention.

Turning now to FIG. 1, an apparatus 5 for metering organic material 10 into a heated surface 40 is shown. The apparatus 5 includes a container 15 which contains an organic material 10 having at least one component. A rotatable auger 20 is disposed in an auger enclosure 22 which in turn is disposed in a material receiving relationship with the container 15. The auger enclosure 22 has openings 24 for receiving powdered material from the container 15. The rotatable auger 20 moves material along a feed path 25 to a feeding location 30. Rotation of the rotatable auger 20 by a motor 45 causes the organic material to be subject to pressure at a feeding location 30; such pressure forces the organic material 10 through one or more openings 35 formed in a member 36. The member 36 can be a part of the auger enclosure 22. The pressure on the powdered material 10 at the feeding location 30 forces the powdered material 10 into contact with the heated surface 40 where the material is flash evaporated. The proximity of the feeding location 30 to the heated surface 40 can cause the feeding location 30 to be heated by radiation. The auger enclosure 22 can also be heated by conduction. It can be desirable to coat the feeding location 30 and the openings 35 as well with a thermally insulating layer such as anodization or a thin layer of glass or mica. Additionally, the feeding location 30 can be made of a material of high thermal conductivity and provided with a thermally conductive path 65 to a heat sink 70. The heat sink 70 can be a passive device which depends on radiation or convection of heat to a fluid, or it can be an active cooling device such as a Peltier effect chiller. Insulating the feeding location 30 and providing a conductive path 65 to the heat sink 70 improves material lifetime within the auger enclosure 22 and can reduce condensation of material in the feeding location 30, especially around the openings 35.

The apparatus 5 can operate in a closed-loop control mode, in which case a sensor 50 is used to measure the vaporization rate of the organic material 10 as it is evaporated at the heated surface 40. The sensor 50 can also be used in measuring the material vaporization rate either directly or indirectly. For example, a laser can be directed through the plume of evaporated material to directly measure the local concentration of material. Alternatively, crystal rate monitors can indirectly measure the vaporization rate by measuring the rate of deposition of the vaporized material. These two approaches represent only two of the many well-known methods for sensing the vaporization rate.

Figure 2:
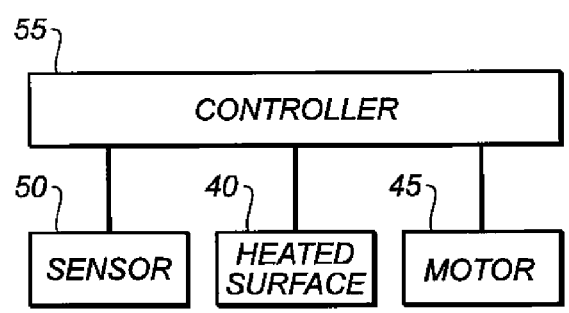
FIG. 2 is a block diagram of the control of the system shown in FIG. 1.

Turning now to FIG. 2, the apparatus 5 can be operated under closed-loop control which is represented by block diagram. In a close-loop control system, the sensor 50 provides data to a controller 55 which in turn determines the rate of revolution of the motor 45. The closed loop control can take many forms. In a particularly preferred embodiment, the controller 55 is a programmable digital logic device, such as a microcontroller, which reads the input of the sensor 50, which can be either analog input or direct digital input. The controller 55 is operated by an algorithm which uses the sensor input as well as internal or externally derived information about therotational speed of the motor 45 and the temperature of the heated surface 40 to determine a new commanded speed for the rotatable auger 20 and a new commanded temperature for the heated surface 40 (see FIG. 1). There are many known classes of algorithm, such as proportional integral differential control, proportional control, differential control, that can be adapted for use suited to control the apparatus 5. The control strategy can employ feedback or feedforward. Alternatively, the controller 55 can be implemented as an analog control device, which can perform the functions set forth above.

Figure 3:
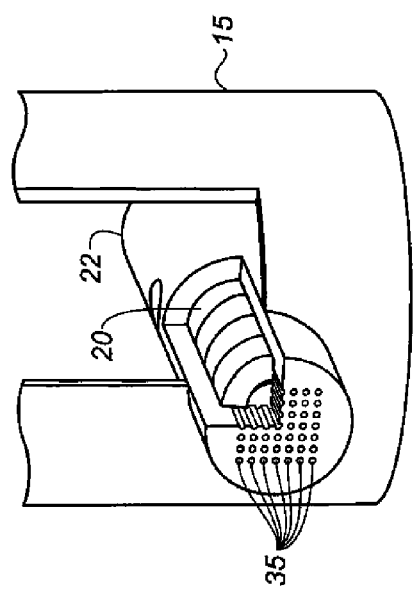
FIG. 3 is a detailed view of the apparatus shown in FIG. 1.

FIG. 3. shows in greater detail a particular configuration using a plurality of openings 35. The openings 35 are shown in the planar face of the auger enclosure 22 which is perpendicular to the axis of the rotatable auger 20. Although shown as a regular array of small circular cross-section openings, the openings 35 can take different forms, can be disposed in different arrangements, and can be placed on the cylindrical face of the auger enclosure 22. When the organic material 10 is particulate in nature, the openings 35 should be larger than the organic material particle size when the particles have reached the openings 35. It is further desirable that the particles be less than one-half the opening size, and preferably less than 2 mm in diameter. Maintaining a particle size distribution in which the particles are nearly uniform and at most one-half the size of the openings 35 will reduce powder packing around the rotatable auger 20 as well as in the openings 35.

Figure 4:
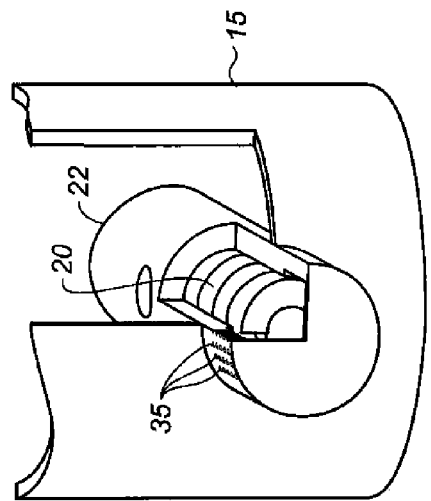
FIG. 4 is an alternative embodiment of the apparatus shown in FIG. 3.

FIG. 4 illustrates an alternative embodiment in which the openings 35 are placed on the cylindrical face of the auger enclosure 22. As noted in the description of FIG. 3, the arrangement and shape of the openings 35 are illustrative of only one of the number of arrangements and shapes of the openings 35.

Figure 5:
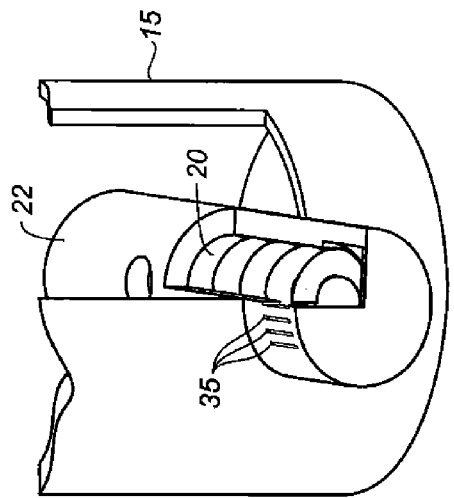
FIG. 5 is another embodiment of the apparatus shown in FIG. 3.

FIG. 5 illustrates yet another embodiment of the invention. In this case, the openings 35 are slits, rather than cylindrical holes. Like the holes in FIG. 4, the openings 35 are disposed on the cylindrical face of the auger enclosure 22. Although these figures have illustrated openings which are either parallel or perpendicular to the axis of rotation of the auger, one of ordinary skill in the art will appreciate that other orientations for the openings, such as those inclined to the axis of the rotatable auger 20 can be used.

Figure 6B:
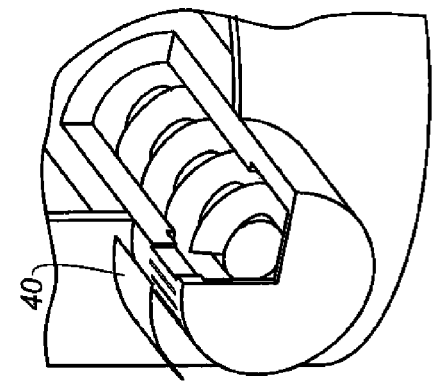
FIG. 6 illustrates a detail regarding the heated surface.
Figure 6A:
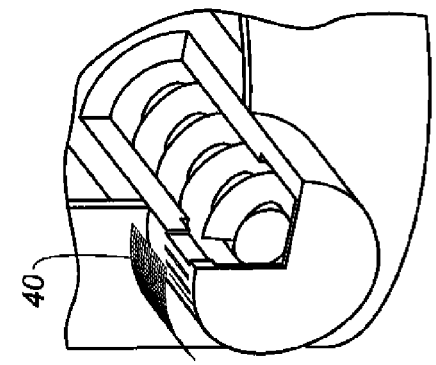

FIG. 6 illustrates two embodiments of providing the heated surface 40. In FIG. 6A the heated surface 40 is formed from a screen material. In FIG. 6B the heated surface 40 is formed from a solid material. Although the choice of the screen material is illustrated in the context of the radially located openings, it is understood that the axially located heated surface 40 as shown in FIG. 1 could also be either solid or contain openings as would be present in a screen. The term screen is not intended to restrict the invention to screens made of woven fibers or wires, but rather refer to any material containing a substantially open fraction, such as perforated metals. The distance of the heated surface 40 is typically only a few thousandths of an inch from the openings 35. For clarity, the figures are not to scale in this respect.

Figure 7:
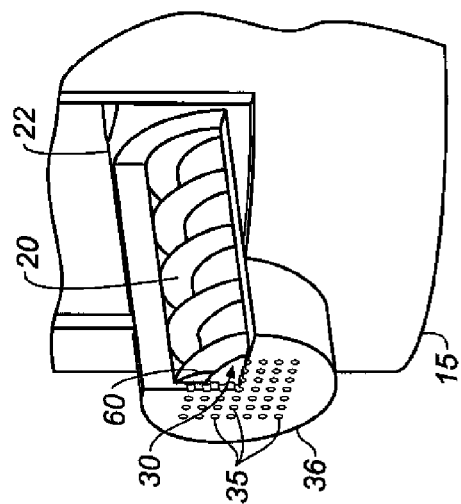
FIG. 7 is a detailed view of an alternative embodiment of the invention.

Turning to FIG. 7, a wiper 60 is located at the end of the rotatable auger 20 and rotates with the rotatable auger 20. The wiper 60 contacts the member 36 containing the openings 35. As the rotatable auger 20 rotates, powder is delivered to the feeding location 30 where the rotation of the wiper 60 creates a converging wedge of material between wiper 60 and member 36 which can impart a larger force on the powder than the auger alone, forcing the powder through even very small openings. The powder is thus compacted under a very high pressure, permitting the material exiting via the openings 35 to bridge the distance from the openings 35 to the heated surface 40. (See FIGS. 6A and 6B) Although the wiper 60 is shown as being integrally formed with the rotatable auger 20, it should be clear to one of ordinary skill in the art that the wiper 60 and rotatable auger 20 can be formed independently. When separately driven, the rotatable auger 20 and the wiper 60 can be rotated at independent speeds and they can be rotated in opposite directions. Although the wiper 60 is shown in a configuration utilizing axially oriented openings, it will be clear to one of ordinary skill that the wiper 60 can be configured to operate with radially aligned holes and inclined holes.

Figure 8:
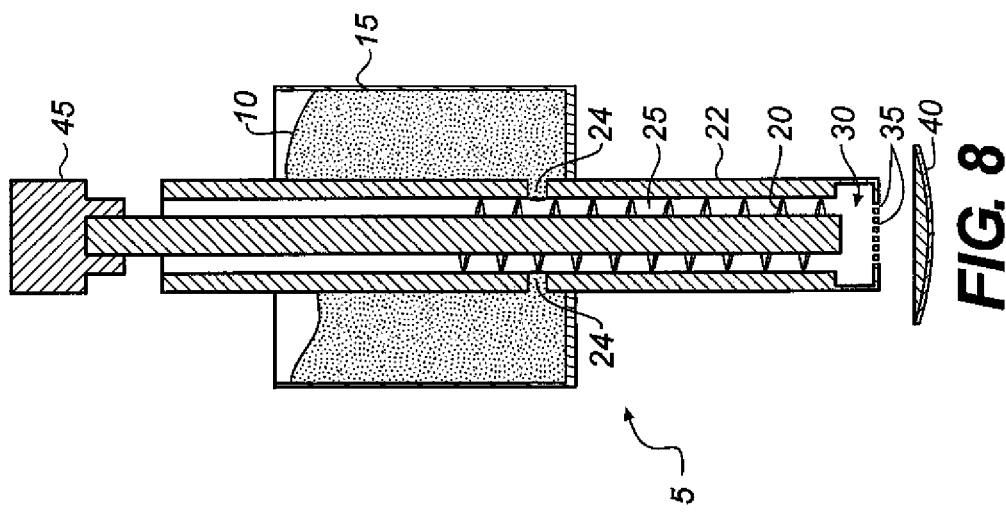
FIG. 8 is a cross-section of another alternative embodiment of the invention.

FIG. 8 illustrates another configuration. The auger enclosure 22 is oriented vertically within the container 15. Thus, the orientation of the rotatable auger 20 is not limited to horizontal, but rather that it can be arbitrarily oriented.

FIG. 8 depicts that the heater surface 40 is provided by a crucible, often called a boat when used in vaporization devices. Thus, the heated surface is not limited to screens or thin sheets of conductive material, but rather can have an arbitrary form so long as it is maintained at a temperature sufficient to flash vaporize material exiting the openings 35 on the auger enclosure 22.

Figure 9:
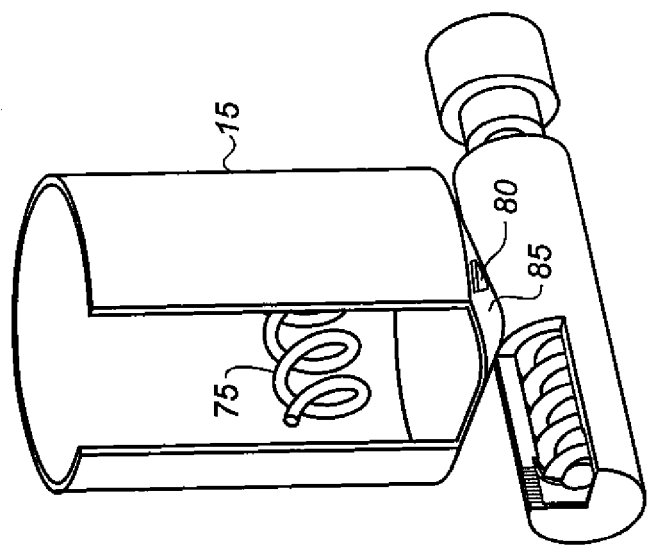
FIG. 9 is a cross-section illustrating mechanisms for increasing material fluidity.

In FIG. 9 an agitator screw 75 is incorporated into the container 15. Rotation of the agitator screw 75 reduces compaction of the powdered material and increases its fluid-like behavior. In addition, vibratory actuators 80 are provided on a funnel 85. The funnel 85 guides the material while the vibratory actuators 80 reduce consolidation of the material and blocking of the funnel.

This invention has been described as using organic materials, however, it is suitable for vaporization of any powdered or granular material.

The invention has been described in detail with particular reference to certain preferred embodiments thereof, but it will be understood that variations and modifications can be effected within the spirit and scope of the invention.

PARTS LIST

5 Feeding apparatus
10 Organic material
15 Container
20 Rotatable auger
22 Auger enclosure
24 Auger enclosure opening
25 Feed path
30 Feeding location
35 Opening
36 Member
40 Heated surface
45 Motor
50 Sensor
55 Controller
60 Wiper
65 Thermally conductive path
70 Heat Sink
75 Agitator screw
80 Vibratory actuator
85 Funnel

The invention claimed is:

1. A method for metering thermally sensitive powdered or granular material onto a heated surface to vaporize such material, comprising:
    (a) providing a container with powdered or granular material having at least one component;
    (b) providing a feeding location and a perforated member at the feeding location that is in proximity to but not touching the heated surface;
    (c) providing a thermally conductive path from the perforated member at the feeding location to a heat sink;
    (d) providing an auger enclosure and a rotatable auger, whose terminus is at the feeding location, disposed in material receiving relationship with the container for receiving powdered or granular material, and as the rotatable auger rotates such rotating rotatable auger translates such powdered or granular material to the feeding location such that the thermally conductive path reduces thermal exposure of the material and thereby improves the material lifetime within the auger enclosure;
    (e) providing openings in the perforated member such that the pressure produced by the rotating auger at the feeding location causes the powdered or granular material to be forced through the openings onto the heated surface where the material is flash evaporated in a controllable manner.

2. The method of claim 1 in which the powdered or granular material is an organic material and is vaporized in order to deposit a thin film organic layer on an OLED.

3. The method according to claim 1 wherein the powdered or granular material is in particulate form and sized as to be smaller than the openings.

4. The method according to claim 3 wherein the particle size is less than half of the opening size.

5. The method according to claim 3 wherein the openings are circular in cross-section and the openings are less than 2 mm in diameter.

6. The method according to claim 1 wherein the opening is at least one slit disposed either parallel to the feed path of the powdered or granular material or inclined to the feed path or perpendicular to the feed path of the powdered or granular material.

7. The method of claim 1 wherein the openings are disposed either parallel to the feed path of the powdered or granular material or inclined to the feed path or perpendicular to the feed path of the powdered or granular material.

8. The method of claim 1 further including controlling the speed of rotation of the rotatable auger and the temperature of the heated surface.

* * * * *